US012784845B2

(12) United States Patent
Lee

(10) Patent No.: US 12,784,845 B2
(45) Date of Patent: Nov. 3, 2026

(54) STORAGE DEVICE AND METHOD FOR REFRESH OPERATION BY DETECTING THRESHOLD VOLTAGE OF STRINGS

(71) Applicant: SK hynix Inc., Icheon-si (KR)

(72) Inventor: Ji Hyun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 131 days.

(21) Appl. No.: 18/674,569

(22) Filed: May 24, 2024

(65) Prior Publication Data

US 2025/0182831 A1 Jun. 5, 2025

(30) Foreign Application Priority Data

Dec. 5, 2023 (KR) ........................ 10-2023-0174153

(51) Int. Cl.

*G11C 16/34* (2006.01)
*G11C 16/08* (2006.01)
*G11C 16/10* (2006.01)

(52) U.S. Cl.

CPC .......... *G11C 16/3418* (2013.01); *G11C 16/08* (2013.01); *G11C 16/102* (2013.01)

(58) Field of Classification Search

CPC ... G11C 16/3418; G11C 16/08; G11C 16/102; G11C 16/3495; G11C 16/3431; G11C 16/0483; G11C 16/10; G11C 16/105; G11C 29/08; G11C 29/12005; G11C 29/20; G11C 29/4401; G11C 29/52; G11C 29/025; G11C 29/18; G11C 13/0033; G11C 13/0035; G11C 2029/1202; G11C 2029/4402; G06F 3/0658

See application file for complete search history.

(56) References Cited

U.S. PATENT DOCUMENTS 11,049,547 B1 * 6/2021 Lee ........................ G11C 16/28
2014/0136765 A1 * 5/2014 Oh ..................... G11C 16/0483
711/103

(Continued)

FOREIGN PATENT DOCUMENTS

KR 1020140096875 A 8/2014
KR 1020170037722 A 4/2017

(Continued)

OTHER PUBLICATIONS

Extended European Search Report (EESR) issued by European Patent Office for European Patent Application No. 24215657.8, on Apr. 22, 2025.

*Primary Examiner* — Sultana Begum

(57) ABSTRACT

A storage device may include a memory device including a memory block including a plurality of strings each including a plurality of memory cells and configured to perform a threshold voltage detecting operation of detecting a threshold voltage corresponding to each of the plurality of strings by simultaneously applying a detecting voltage to a plurality of word lines coupled to the plurality of memory cells, and a memory controller configured to receive read data read by the threshold voltage detecting operation from the memory device, to determine a number of strings having a lower threshold voltage than the detecting voltage on the basis of the read data, and to determine whether to perform a refresh operation on the memory block based on the determined number of strings.

16 Claims, 14 Drawing Sheets

(56) References Cited

U.S. PATENT DOCUMENTS

| | | | | |
|---|---|---|---|---|
| 2016/0350179 | A1* | 12/2016 | Lin | G06F 11/1012 |
| 2017/0221583 | A1 | 8/2017 | Shin | |
| 2019/0348103 | A1* | 11/2019 | Jeong | G11C 13/0069 |
| 2020/0192971 | A1* | 6/2020 | Lue | G11C 16/08 |
| 2023/0060312 | A1* | 3/2023 | Moschiano | G11C 16/102 |

FOREIGN PATENT DOCUMENTS

| | | | |
|---|---|---|---|
| KR | 101824068 | B1 | 1/2018 |
| KR | 1020220079235 | A | 6/2022 |

* cited by examiner

FIG. 4

| PGM WL COUNT | VOLTAGE LEVEL |
|---|---|
| 1 | VOLT11~VOLT1m |
| 2 | VOLT21~VOLT2m |
| 3 | VOLT31~VOLT3m |
| ⋮ | ⋮ |
| n | VOLTn1~VOLTnm |

STORAGE DEVICE AND METHOD FOR REFRESH OPERATION BY DETECTING THRESHOLD VOLTAGE OF STRINGS

CROSS-REFERENCE TO RELATED APPLICATION

The present application claims priority under 35 U.S.C. § 119(a) to Korean patent application number 10-2023-0174153, filed on Dec. 5, 2023, in the Korean Intellectual Property Office, the entire disclosure of which is incorporated herein by reference.

BACKGROUND

1. Technical Field

Various embodiments generally relate to a semiconductor device, and more particularly, to a storage device performing a refresh operation and a method of operating the storage device.

2. Related Art

Storage devices store data in response to control by host devices such as computers, mobile terminals such as smartphones or tablets, or various types of electronic devices. A storage device may include a memory device that stores data and a memory controller that controls the memory device.

However, the data that is stored in the memory device may be gradually damaged or may degrade for various reasons. In other words, when a predetermined time passes after the data is stored, characteristics of a memory device, such as retention characteristics, may deteriorate. The storage device may perform a scan operation to check for deterioration of retention characteristics. When it is determined, as a result of the scan operation, that the data is damaged, the storage device may perform a refresh operation by which the data is stored at a new location before the data is too damaged to be recovered.

The scan operation may take time to read data. A method of reducing reading time may result in operational improvements.

SUMMARY

Various embodiments of the present disclosure are directed to a storage device improving performance of a scan operation and reducing a time consumed to perform the scan operation, and a method of operating the storage device.

According to an embodiment, a storage device may include a memory device including a memory block. including a plurality of strings each including a plurality of memory cells, configured to perform a threshold voltage detecting operation of detecting a threshold voltage corresponding to each of the plurality of strings by simultaneously applying a detecting voltage to a plurality of word lines coupled to the plurality of memory cells, and a memory controller configured to receive read data read by the threshold voltage detecting operation from the memory device, to determine a number of strings having a lower threshold voltage than the detecting voltage on the basis of the read data, and to determine whether to perform a refresh operation on the memory block based on the determined number of strings.

According to an embodiment, a method of operating a storage device may include sequentially applying a plurality of threshold voltage detecting voltages to a plurality of word lines coupled to a memory block, acquiring read data corresponding to each of the plurality of threshold voltage detecting voltages, detecting a threshold voltage distribution of the memory block on the basis of the read data, and determining a degree of deterioration of retention characteristics of the memory block on the basis of the threshold voltage distribution.

According to an embodiment, a storage device may include a memory device including a memory block including a plurality of strings each including a plurality of memory cells, configured to perform a first threshold voltage detecting operation of detecting a threshold voltage corresponding to each of the plurality of strings by simultaneously applying a first detecting voltage to first word lines among a plurality of word lines coupled to the plurality of memory cells, and to perform a second threshold voltage detecting operation of detecting the threshold voltage corresponding to each of the plurality of strings by simultaneously applying a second detecting voltage to second word lines, among the plurality of word lines, and a memory controller configured to receive first read data read by the first threshold voltage detecting operation and second read data read by the second threshold voltage detecting operation from the memory device, to determine a number of first strings having a lower threshold voltage than the first detecting voltage on the basis of the first read data, to determine a number of second strings having a lower threshold voltage than the second detecting voltage on the basis of the second read data, and to determine whether to perform a refresh operation on the memory block based on the determined number of first strings and the determined number of second strings.

BRIEF DESCRIPTION OF THE DRAWINGS

FIG. 4 is a diagram illustrating a plurality of threshold voltage detecting voltages according to an embodiment of the present disclosure;

DETAILED DESCRIPTION

Specific structural or functional descriptions of examples of embodiments in accordance with concepts disclosed in this specification are illustrated only to describe the examples of embodiments in accordance with the concepts. The examples of embodiments in accordance with the concepts may be carried out in various forms, but the descriptions are not limited to the examples of embodiments described in this specification.

Figure 1:
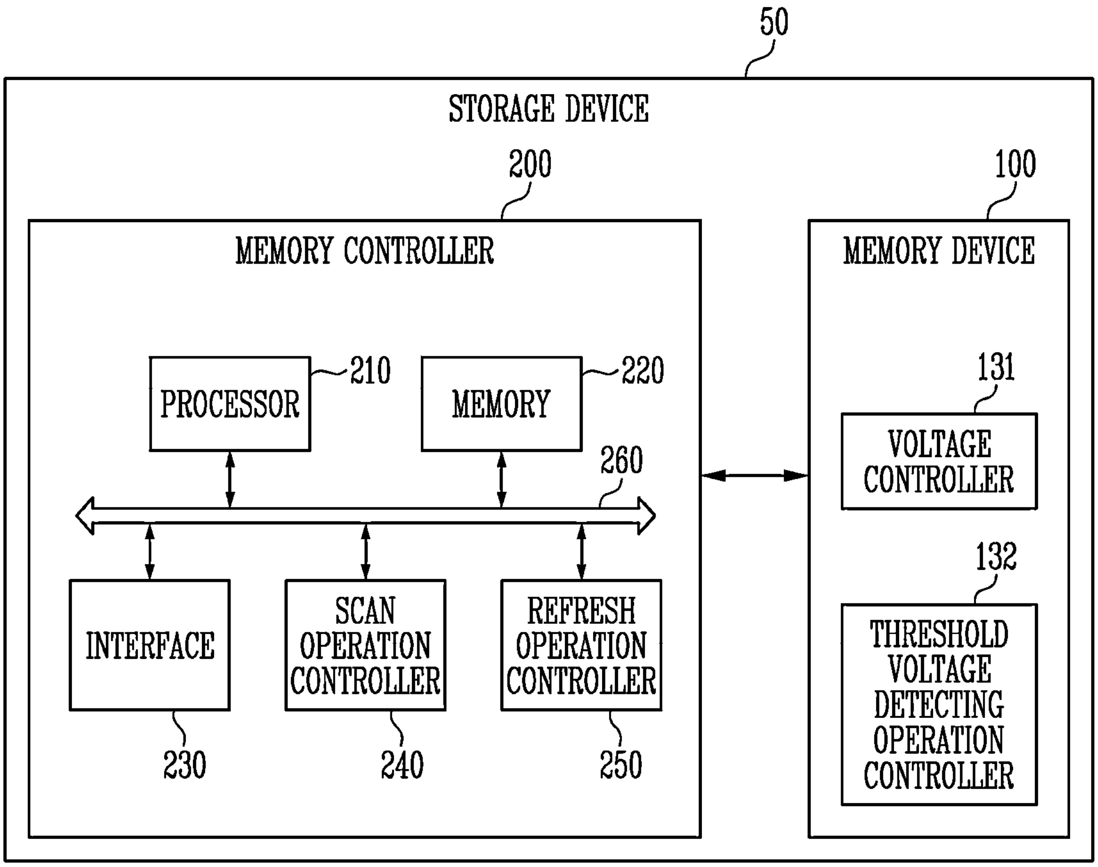
FIG. 1 is a diagram illustrating a storage device according to an embodiment of the present disclosure.

FIG. 1 is a diagram illustrating a storage device according to an embodiment of the present disclosure.

Referring to FIG. 1, a storage device 50 may store data in response to control by a host device (not shown). Examples of the host devices may include a cellular phone, a smartphone, an MP3 player, a laptop computer, a server computer, a desktop computer, a game player, a television, a tablet PC, or an in-vehicle infotainment system.

The storage device 50 may include a memory device 100 and a memory controller 200, which controls operations of the memory device 100.

The storage device 50 may be one of various storage devices such as a multimedia card (SSD, MMC, or eMMC), a universal serial bus (USB) storage device, a universal flash storage (UFS) device, a peripheral component interconnection (PCI) or PCI-express (PCI-E) card type storage device, a compact flash (CF) card, a smart media card, a memory stick, and the like.

The storage device 50 may be manufactured in any one of various types of packages. For example, the storage device 50 may be manufactured as any one of various kinds of package types, such as package-on-package (POP), system-in-package (SIP), system-on-chip (SOC), multi-chip package (MCP), chip-on-board (COB), wafer-level fabricated package (WFP), and wafer-level stack package (WSP).

The memory device 100 may store data. The memory device 100 may include a plurality of memory blocks that store data. Each of the memory blocks may include a plurality of memory cells.

According to an embodiment, the memory device 100 may be a non-volatile memory that does not lose data even when power supply is blocked. According to the present disclosure, for convenience of explanation, descriptions will be made on the assumption that the memory device 100 is a NAND flash memory.

According to an embodiment, the memory device 100 may receive a command and an address from the memory controller 200. The memory device 100 may perform an operation instructed by the command on an area selected in response to the address. For example, the memory device 100 may perform a write operation (or a program operation), a read operation, and an erase operation.

According to an embodiment, the memory device 100 may include a voltage controller 131 and a threshold voltage detecting operation controller 132.

The voltage controller 131 may control operating voltages for a write operation, a read operation, and an erase operation.

According to an embodiment, the voltage controller 131 may control the generation of a plurality of threshold voltage detecting voltages. A threshold voltage detecting voltage may be applied to perform a threshold voltage detecting operation. The threshold voltage detecting operation may be performed to detect a threshold voltage distribution of a memory block in response to control of a scan operation controller 240.

According to an embodiment, the threshold voltage detecting operation controller 132 may control a threshold voltage detecting operation. The threshold voltage detecting operation controller 132 may apply a target threshold voltage detecting voltage, from among a plurality of threshold voltage detecting voltages, to a plurality of word lines coupled to the memory block at the same time. In addition, the threshold voltage detecting operation controller 132 may sequentially apply the plurality of threshold voltage detecting voltages to the plurality of word lines.

The memory controller 200 may control general operations of the storage device 50.

When power is applied to the storage device 50, the memory controller 200 may execute firmware FW. When the memory device 100 is a flash memory device, the firmware FW may include a host interface layer HIL that controls communication with the host device, a flash translation layer FTL that controls communication between the host device and the memory device 100, and a flash interface layer FIL that controls communication with the memory device 100.

According to an embodiment, the memory controller 200 may receive data and a logical block address LBA from the host device and convert the logical block address LBA into a physical block address PBA, which indicates an address of memory cells in which the data in the memory device 100 is stored. In the present disclosure, the expression "logical block address" may have the same meaning as "logic address" or "logical address." In addition, the expression "physical block address" may have the same meaning as "block address" or "physical address."

According to an embodiment, the memory controller 200 may provide the memory device 100 with a command, an address, or data corresponding to a program operation, a read operation, or an erase operation so that the memory device 100 may perform the corresponding operation in response to the host device.

According to an embodiment, the memory controller 200 may provide the memory device 100 with a command, an address, or data corresponding to a program operation, a read operation, or an erase operation so that the memory device 100 may perform the corresponding operation in response to a request from the host device. For example, the memory controller 200 may provide the memory device 100 with a command, an address, and data for performing a program operation and read operations involved in performing an internal operation such as a wear leveling operation, a read reclaim operation, a garbage collection operation, a scan operation, and a refresh operation.

According to an embodiment, the memory controller 200 may include a processor 210, a memory 220, an interface 230, the scan operation controller 240, and a refresh operation controller 250. The processor 210, the memory 220, the interface 230, the scan operation controller 240, and the refresh operation controller 250 may communicate through a communication bus 260. Though not shown in FIG. 1, the memory controller 200 may further include an error detection/correction circuit, which performs error detection/correction on data.

The processor 210 may execute firmware including various types of information required for the memory controller 200 to operate, codes, or at least one command.

The memory 220 may serve as a buffer memory, a cache memory, an operation memory, and the like.

In addition, the memory 220 may store firmware including various types of information required for the memory controller 200 to operate, codes, or at least one command.

The interface 230 may include a host interface for communicating with the host device and a memory interface for communicating with the memory device 100.

The scan operation controller 240 may perform a scan operation for determining retention characteristics of a memory block. A scan operation may include a threshold voltage detecting operation for detecting a threshold voltage distribution of a memory block. During the threshold voltage detecting operation, a threshold voltage corresponding to each of a plurality of strings included in the memory block may be detected, and a threshold voltage distribution of the memory block may be detected on the basis of the threshold voltage corresponding to each of the plurality of strings. A target memory block on which the scan operation is performed may correspond to a memory block on which a program operation has been performed. That is, at least one of the plurality of word lines that are included in the target memory block may correspond to a program state. In addition, at least one of the plurality of memory cells included in the target memory block may be a memory cell that is programmed into any one of the plurality of program states, which are divided from each other on the basis of threshold voltages.

According to an embodiment, the scan operation controller 240 may provide the memory device 100 with an address corresponding to the plurality of word lines and a command for instructing performance of a threshold voltage detecting operation.

According to an embodiment, the scan operation controller 240 may receive read data, which is read by the threshold voltage detecting operation from the memory device 100, and may count strings having a lower threshold voltage than a target threshold voltage detecting voltage, from among the plurality of strings, on the basis of the read data. The scan operation controller 240 may determine whether to perform a refresh operation on the memory block on the basis of the string count. For example, the scan operation controller 240 may send a signal to the refresh operation controller 250 to perform a refresh operation when the string count is greater than a predetermined threshold value.

According to an embodiment, the scan operation controller 240 may determine whether a weak word line read operation is performed on the memory block on the basis of the string count. A weak word line read operation may be performed on at least one weak word line, which is set beforehand from among the plurality of word lines. For example, the scan operation controller 240 may pre-store a list of weak word lines among the plurality of word lines. The weak word lines may be determined by a variety of factors such as physical locations of word lines, a read failure or success during a read operation, and a predetermined policy. When it is determined that the weak word line read operation is performed, the scan operation controller 240 may provide the memory device 100 with an address corresponding to at least one weak word line and a command to perform a weak word line read operation. The scan operation controller 240 may receive read data that is read in the weak word line read operation, and may determine whether or not to perform a refresh operation. For example, the scan operation controller 240 may transmit a signal to the refresh operation controller 250 to perform a refresh operation when there are a lot of errors in the read data.

The refresh operation controller 250 may control a refresh operation.

According to an embodiment, retention characteristics of the memory device 100 may deteriorate when a predetermined time passes after data is programmed. To make up for such deterioration in retention characteristics, the refresh operation controller 250 may control the memory device 100 to move the data, which is stored in the target memory block on which a refresh operation is performed, to another memory block, and to perform an erase operation on the target memory block.

A highest program state, which has the highest threshold voltage among the plurality of program states, may move in a direction in which the threshold voltage decreases due to weak retention characteristics. However, it may be difficult to distinguish the highest program state from the other program states by a read voltage. Thus, a page that is read using the read voltage corresponding to the highest program state may have weak retention characteristics.

Figure 2:
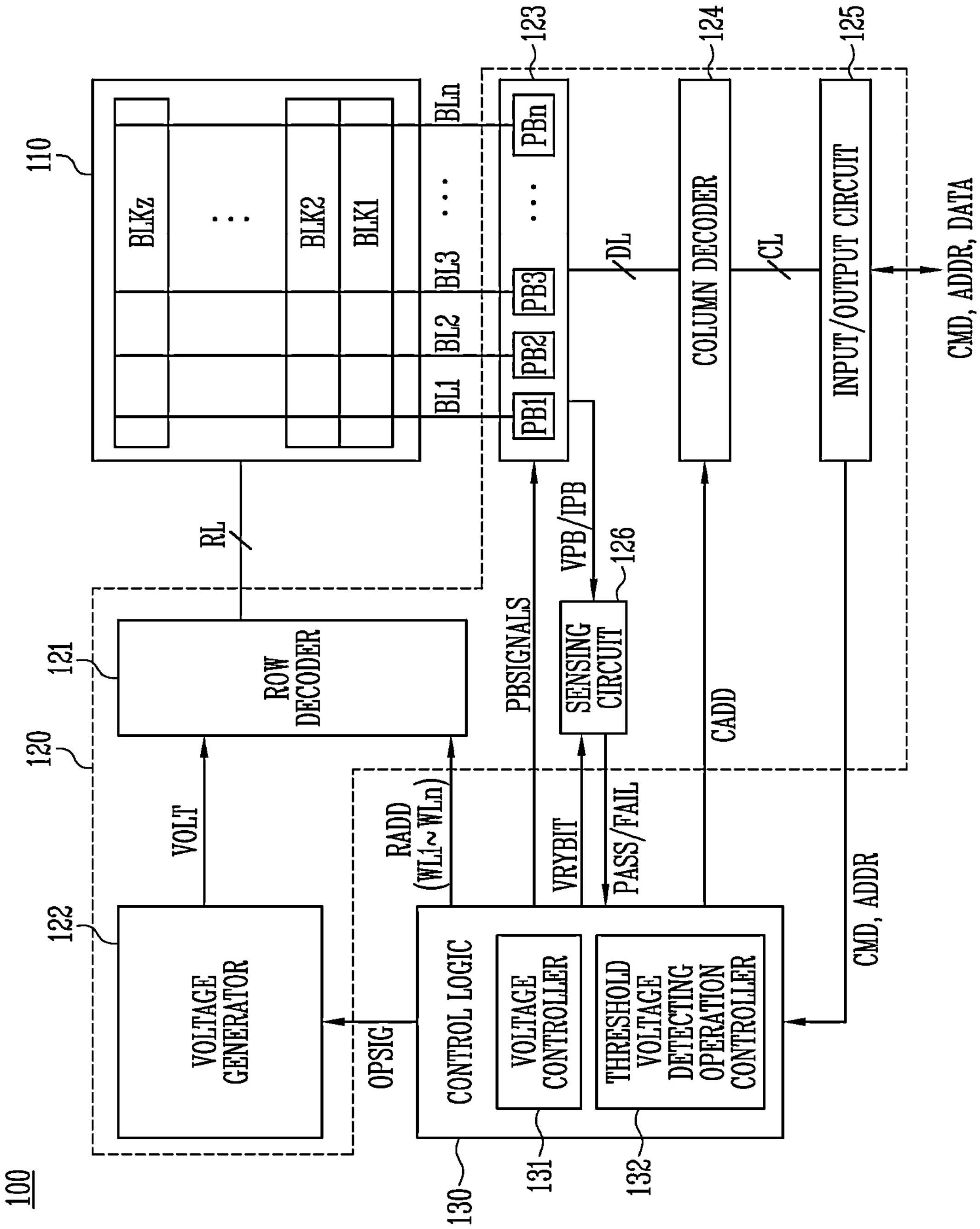
FIG. 2 is a diagram illustrating a memory device according to an embodiment of the present disclosure.

FIG. 2 is a diagram illustrating a memory device according to an embodiment of the present disclosure.

Referring to FIG. 2, a memory device 100 may include a memory cell array 110, a peripheral circuit 120, and a control logic 130.

The memory cell array 110 may include a plurality of memory blocks BLK1 to BLKz.

The plurality of memory blocks BLK1 to BLKz may be coupled to a row decoder 121 through row lines RL.

Each of the plurality of memory blocks BLK1 to BLKz may include a plurality of memory cells. The plurality of memory cells may be coupled to a page buffer group 123 through first to nth bit lines BL1 to BLn.

Each of the plurality of memory cells may correspond to any one of a plurality of states. For example, the plurality of states may include an erase state and a plurality of program states, which are divided from each other on the basis of threshold voltages. Each of the plurality of memory cells may be in an erase state, or may be programmed into any one of the plurality of program states.

The peripheral circuit 120 may be configured to perform a program operation, a read operation, or an erase operation on a selected area of the memory cell array 110 in response to control by the control logic 130.

The peripheral circuit 120 may include the row decoder 121, a voltage generator 122, the page buffer group 123, a column decoder 124, an input/output circuit 125, and a sensing circuit 126.

The row decoder 121 may be configured to decode a row address RADD, which is received from the control logic 130. The row decoder 121 may select at least one memory block among the memory blocks BLK1 to BLKz according to the decoded address. In addition, the row decoder 121 may select at least one word line of the selected memory block according to the decoded address. The row decoder 121 may apply operating voltages generated by the voltage generator 122 to the selected word line.

According to an embodiment, the row decoder 121 may apply a threshold voltage detecting voltage VOLT to a plurality of word lines coupled to a target memory block during a threshold voltage detecting operation.

The voltage generator 122 may generate an internal power voltage by regulating an external power voltage that is supplied to the memory device 100. The internal power voltage generated by the voltage generator 122 may serve as an operating voltage of the memory device 100. The voltage generator 122 may generate various operating voltages for program, read, and erase operations in response to an operation signal OPSIG. For example, the voltage generator 122 may generate a program voltage, a verify voltage, a read voltage, an erase voltage, and the threshold voltage detecting voltage VOLT.

The page buffer group 123 may include a plurality of first to nth page buffers PB1 to PBn. In response to page buffer control signals PBSIGNALS, the first to nth page buffers PB1 to PBn may temporarily store data that is received through the first to nth bit lines BL1 to BLn, or may sense voltages or currents in the first to nth bit lines BL1 to BLn during a read or verify operation.

The column decoder 124 may transfer data between the input/output circuit 125 and the page buffer group 123 in response to a column address CADD.

The input/output circuit 125 may transfer a command CMD and an address ADDR received from the memory controller to the control logic 130, or may exchange read data DATA with the column decoder 124.

The sensing circuit 126 may determine whether a verify operation for a predetermined program state passes or not in response to application of a verify voltage.

For example, during a verify operation, the sensing circuit 126 may generate a reference current in response to an allowable bit signal VRYBIT and output a pass signal PASS or a fail signal FAIL by comparing a sensing voltage VPB received from the page buffer group 123 with a reference voltage generated by the reference current. In another example, during a verify operation, the sensing circuit 126 may generate a reference voltage in response to the allowable bit signal VRYBIT and may output the pass signal PASS or the fail signal FAIL by comparing a sensing current IPB received from the page buffer group 123 with a reference current generated by the reference voltage.

The control logic 130 may control the peripheral circuit 120 by outputting the operation signal OPSIG, the row address RADD, and the page buffer control signals PBSIGNALS in response to the command CMD and the address ADDR.

According to an embodiment, the control logic 130 may include a voltage controller 131 and a threshold voltage detecting operation controller 132.

According to an embodiment, the voltage controller 131 may provide the voltage generator 122 with the operation signal OPSIG for instructing to generate the threshold voltage detecting voltage VOLT during a threshold voltage detecting operation.

According to an embodiment, the voltage controller 131 may determine a read voltage which is used to perform a refresh operation on the basis of a degree of deterioration of retention characteristics of a target memory block. The voltage controller 131 may provide the voltage generator 122 with the operation signal OPSIG for instructing to generate the determined read voltage during the refresh operation.

According to an embodiment, the threshold voltage detecting operation controller 132 may control the row decoder 121 to apply the threshold voltage detecting voltage VOLT to the plurality of word lines during the threshold voltage detecting operation. For example, the threshold voltage detecting operation controller 132 may provide an address indicating a plurality of word lines WL1 to WLn to the row decoder 121.

Figure 3:
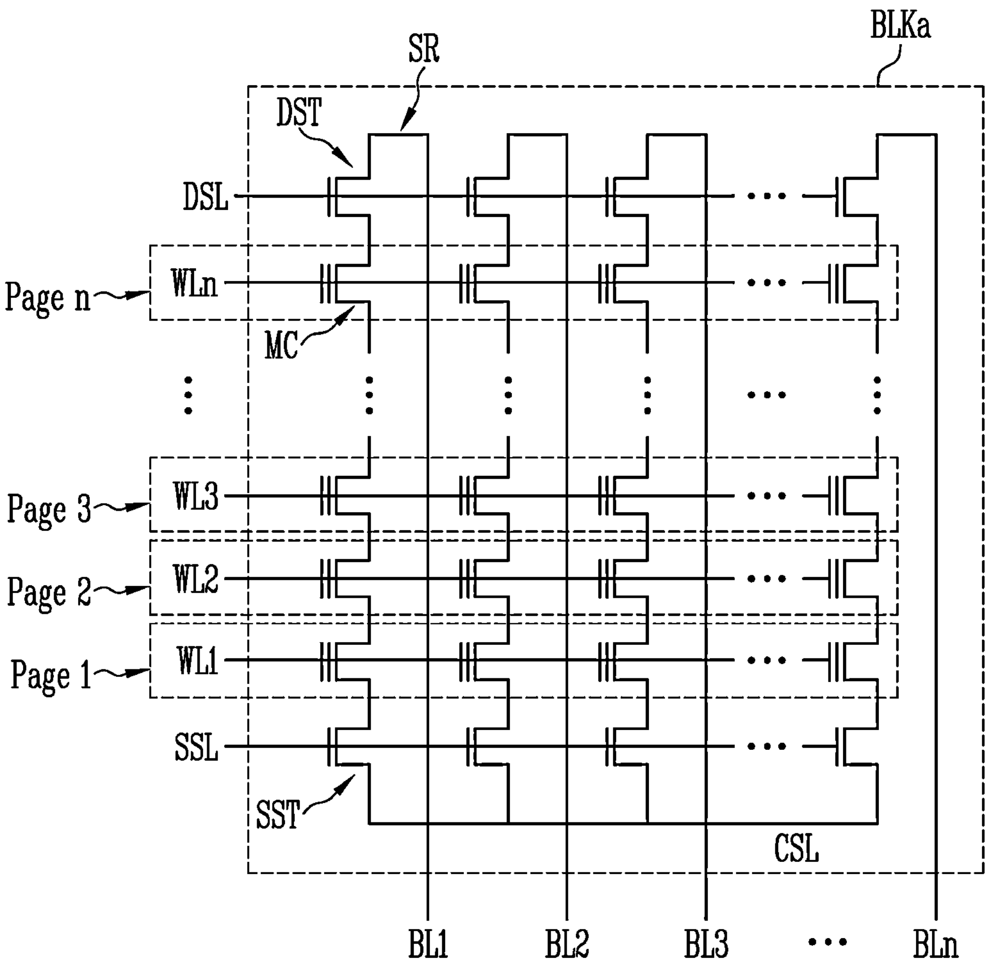
FIG. 3 is a diagram illustrating a memory block according to an embodiment of the present disclosure.

FIG. 3 is a diagram illustrating a memory block according to an embodiment of the present disclosure.

A memory block BLKa as shown in FIG. 3 may refer to one of the memory blocks BLK1 to BLKz as shown in FIG. 2.

Referring to FIG. 3, the memory block BLKa may include a plurality of strings SR. The plurality of strings SR may be coupled to the plurality of first to nth bit lines BL1 to BLn, respectively. Each of the strings SR may include a source select transistor SST, memory cells MC, and a drain select transistor DST. The source select transistor SST of each string SR may be coupled between the memory cells MC and a common source line CSL. The source select transistors SST may be commonly coupled to the common source line CSL. The drain select transistor DST of each string SR may be coupled between the memory cells MC and a bit line BL. The drain select transistors DST of the plurality of strings SR may be coupled to the plurality of first to nth bit lines BL1 to BLn, respectively. In each string SR, the plurality of memory cells MC may be provided between the source select transistor SST and the drain select transistor DST. In each string SR, the plurality of memory cells MC may be coupled in series.

In the plurality of strings SR, the memory cells MC that are located in the same order from the common source line CSL may be commonly coupled to a single word line. The memory cells MC of the plurality of strings SR may be coupled to the plurality of word lines WL1 to WLn.

Memory cells coupled to the same word line in the plurality of strings SR arranged in a row direction may form a single page PAGE. For example, memory cells that are coupled to the first word line WL1 in the plurality of strings SR may constitute a first page PAGE 1. Memory cells that are coupled to a second word line WL2 may form a second page PAGE 2. Memory cells that are coupled to a third word line WL3 may form a third page PAGE 3. Memory cells that are coupled to an nth word line WLn may form an nth page PAGE n.

The memory device may perform a program operation on selected memory cells in response to a program command, which is received from the memory controller. The program operation may be performed in units of pages respectively corresponding to the word lines WL1 to WLn.

According to an embodiment, a program operation corresponding to a program command of a memory controller may be performed on a plurality of pages in a sequential order according to a location of a word line corresponding to each of the pages. For example, the memory controller may select the first to nth pages PAGE 1 to PAGE n as program target pages. The memory controller may control the memory device such that a program operation may be performed on the first to nth pages PAGE 1 to PAGE n in a sequential manner.

However, the order in which the program operation is performed on the plurality of pages may not be limited to this embodiment. For example, the memory controller may control the memory device so that the program operation may be sequentially performed on the first to nth pages PAGE 1 to PAGE n in a reverse order, from the nth page PAGE n to the first page PAGE 1.

FIG. 4 is a diagram illustrating a plurality of threshold voltage detecting voltages according to an embodiment of the present disclosure.

Referring to FIG. 4, voltage levels of the plurality of threshold voltage detecting voltages may be determined by the number of word lines corresponding to an erase state or a program state among a plurality of word lines. A word line corresponding to a program state may refer to a word line on which a program operation has been performed. A word line corresponding to an erase state may refer to a word line on which the program operation has not been performed.

For example, when there is one word line corresponding to a program state, among the plurality of word lines, the voltage controller 131 may control generation of a plurality of threshold voltage detecting voltages VOLT11 to VOLT1*m* during a threshold voltage detecting operation. In addition, when there are two word lines corresponding to the program state, among the plurality of word lines, the voltage controller 131 may control generation of a plurality of threshold voltage detecting voltages VOLT21 to VOLT2*m* during a threshold voltage detecting operation. In addition, when there are three word lines corresponding to the program state, among the plurality of word lines, the voltage controller 131 may control generation of a plurality of threshold voltage detecting voltages VOLT31 to VOLT3*m* during a threshold voltage detecting operation. In addition, when there are 'n' word lines corresponding to the program state, among the plurality of word lines, the voltage controller 131 may control generation of a plurality of threshold voltage detecting voltages VOLTn1 to VOLTnm during a threshold voltage detecting operation.

According to an embodiment, as the number of word lines corresponding to the program state increase, voltage levels of the plurality of threshold voltage detecting voltages may increase accordingly.

Figure 5:
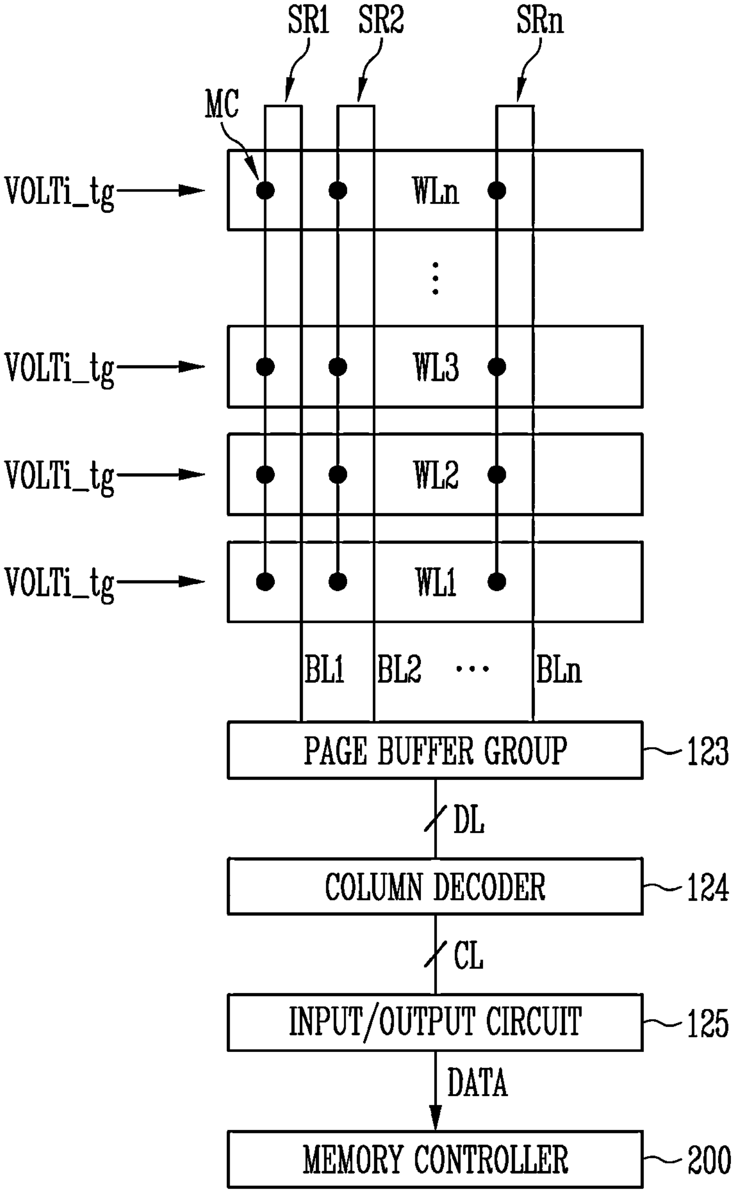
FIG. 5 is a diagram illustrating an example of a threshold voltage detecting operation according to an embodiment of the present disclosure.

FIG. 5 is a diagram illustrating an example of a threshold voltage detecting operation according to an embodiment of the present disclosure. In FIG. 5, an 'i' number of word lines, among the plurality of word lines WL1 to WLn, correspond to a program state.

Referring to FIG. 5, a memory device 100 may apply the same target threshold voltage detecting voltage VOLTi_tg having the same level to the plurality of word lines WL1 to WLn at the same time.

The memory device 100 may provide read data DATA, which is read according to the target threshold voltage detecting voltage VOLTi_tg, to the memory controller 200 through the page buffer group 123, the column decoder 124, and the input/output circuit 125.

According to an embodiment, the memory device 100 may detect a threshold voltage corresponding to each of a plurality of strings SR1 to SRn when the target threshold voltage detecting voltage VOLTi_tg having the same level is applied to the plurality of word lines WL1 to WLn at the same time.

According to an embodiment, a threshold voltage of the memory cell MC may correspond to the amount of charges included in the memory cell MC. For example, the memory cell MC may include a data storage layer in which charges are trapped. The charges may be negative voltages. When the charges are trapped in the charge storage layer, the memory cell MC may have a predetermined threshold value according to the amount of charges trapped in the charge storage layer.

According to an embodiment, a threshold voltage of a string may correspond to the amount of charges included in the charge storage layer of every memory cell MC included in the corresponding string.

Figure 6:
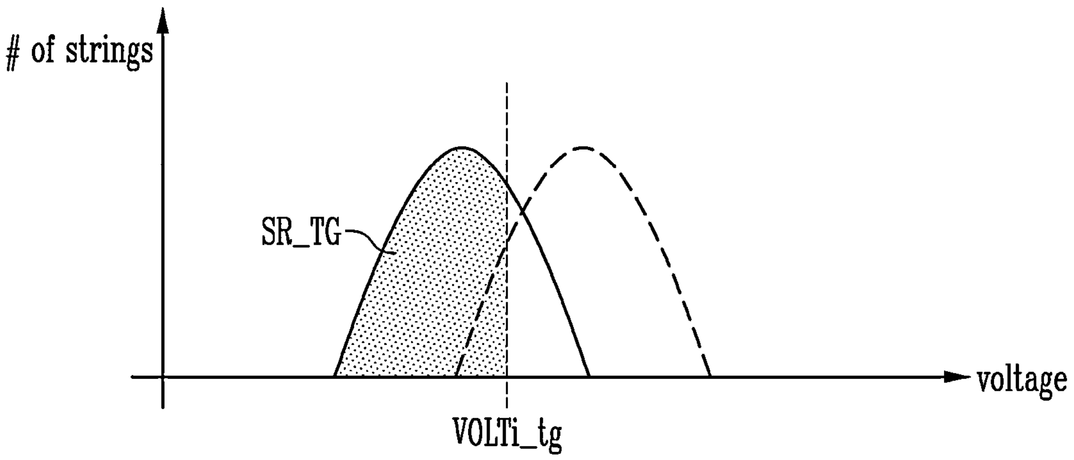
FIG. 6 a diagram illustrating an example of counting strings having a lower threshold voltage than a target threshold voltage detecting voltage.

FIG. 6 a diagram illustrating an example of counting strings having a lower threshold voltage than a target threshold voltage detecting voltage according to an embodiment.

Referring to FIG. 6, a horizontal axis of a graph refers to a voltage magnitude and a vertical axis of the graph refers to the string count. In addition, a threshold voltage distribution indicated by a dotted line may represent an initial threshold voltage distribution of a memory block, and a threshold voltage distribution indicated by a solid line may represent the present threshold voltage distribution of the memory block. The present threshold voltage distribution may shift to the left more than the initial threshold voltage distribution according to retention characteristics of the memory block.

According to an embodiment, a memory controller 200 may count target strings SR_TG having a lower threshold voltage than a target threshold voltage detecting voltage VOLTi_tg among a plurality of strings included in a target memory block on the basis of read data, which is read by a threshold voltage detecting operation.

In addition, the memory controller 200 may control a memory device 100 to perform a refresh operation when the number of target strings SR_TG is greater than a predetermined threshold value.

Figure 7:
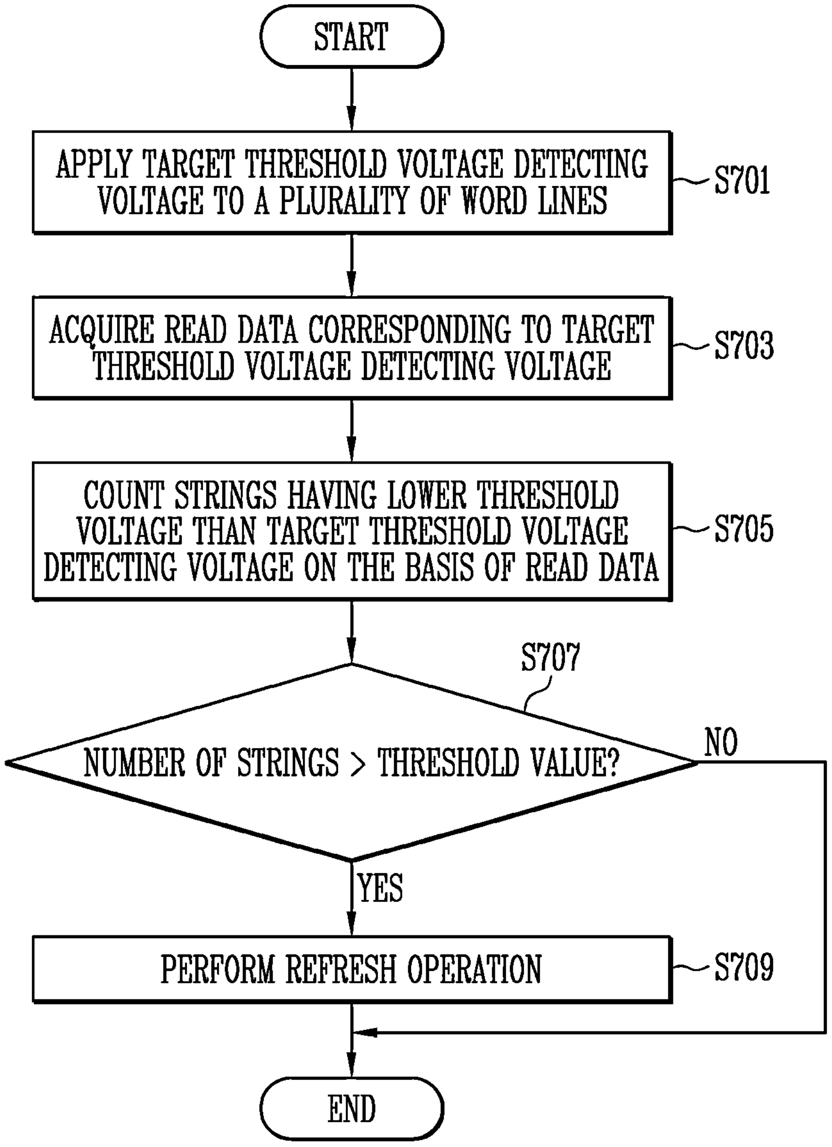
FIG. 7 is a flowchart illustrating an example of a method of determining whether to perform a refresh operation according to an embodiment of the present disclosure.

FIG. 7 is a flowchart illustrating an example of a method of determining whether to perform a refresh operation according to an embodiment of the present disclosure. The method shown in FIG. 7 may be performed by, for example, a storage device 50 shown in FIG. 1.

More specifically, FIG. 7 may show a method of determining whether to perform a refresh operation based on the threshold voltage detecting operation shown in FIG. 5 and the operation of counting strings as shown in FIG. 6.

Referring to FIG. 7, at step S701, the storage device 50 may apply a target threshold voltage detecting voltage to a plurality of word lines at the same time.

At step S703, the storage device 50 may acquire read data corresponding to the target threshold voltage detecting voltage.

At step S705, the storage device 50 may count strings having a lower threshold voltage than the target threshold voltage detecting voltage on the basis of read data.

At step S707, the storage device 50 may determine whether a string count is greater than a predetermined threshold value.

As a result of determination at step S707, when the string count is greater than the predetermined threshold value, the storage device 50 may perform a refresh operation at step S709.

As the result of the determination at step S707, when the string count is not greater than the predetermined threshold value, the process flow may be terminated.

Figure 8:
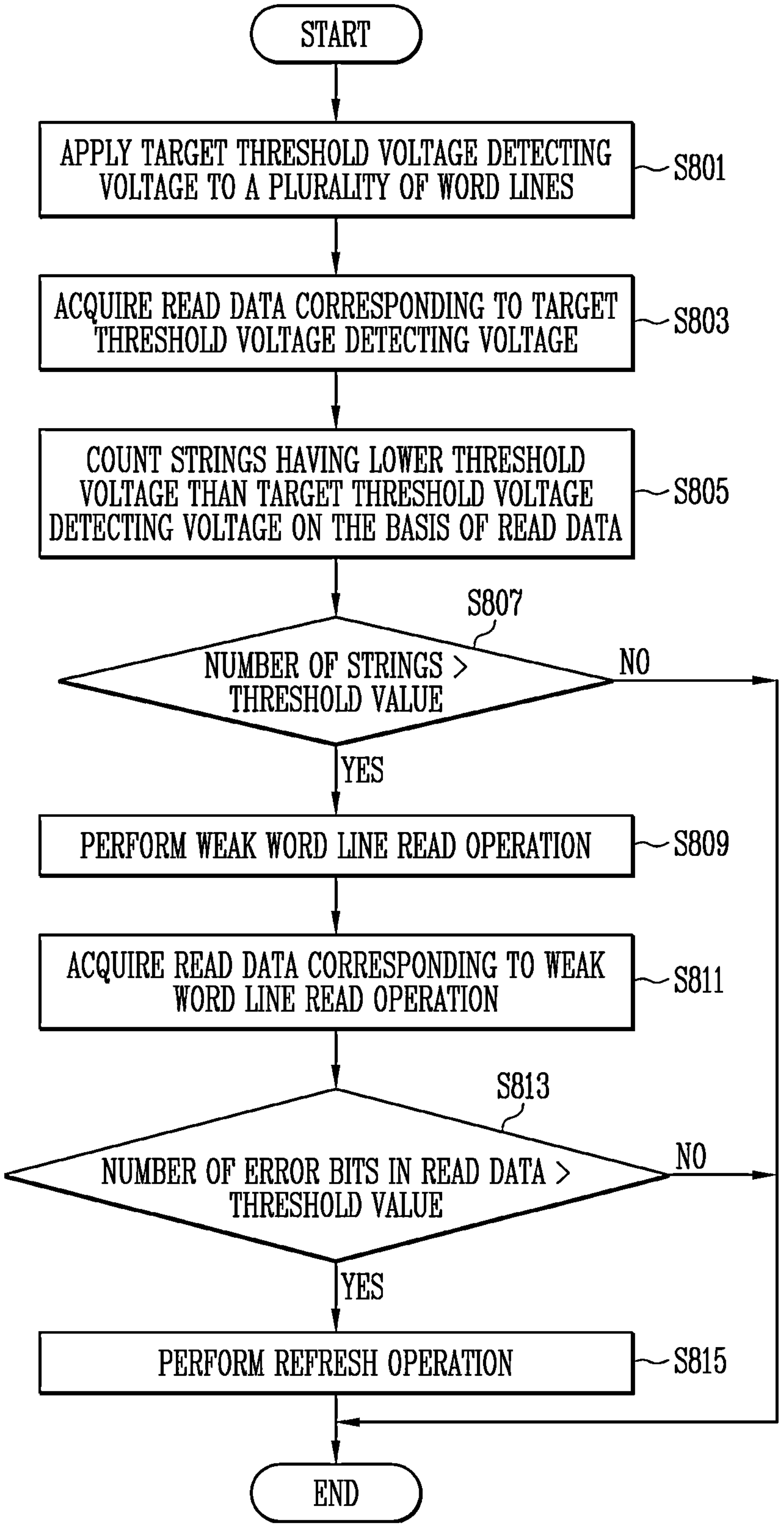
FIG. 8 is a flowchart illustrating another example of a method of determining whether to perform a refresh operation according to an embodiment of the present disclosure.

FIG. 8 is a flowchart illustrating another example of a method of determining whether to perform a refresh operation according to an embodiment of the present disclosure. The method shown in FIG. 8 may be performed by, for example, a storage device 50 shown in FIG. 1.

More specifically, FIG. 8 may show a method of determining whether to perform a refresh operation based on the threshold voltage detecting operation shown in FIG. 5 and the operation of counting strings shown in FIG. 6. In addition, FIG. 8 may show a method of further performing a weak word line read operation in comparison with the method of FIG. 7.

Since steps S801, S803, S805, and S807 as shown in FIG. 8 are the same as steps S701, S703, S705, and S707 as shown in FIG. 7, a detailed description of those steps will be omitted.

Referring to FIG. 8, as a result of determination at step S807, when the string count is greater than a predetermined threshold value, the storage device 50 may perform a weak word line read operation at step S809. On the other hand, as the result of the determination at step S807, when the string count is not greater than the predetermined threshold value, the process flow may be terminated.

At step S811, the storage device 50 may acquire read data corresponding to the weak word line read operation.

At step S813, the storage device 50 may determine whether the number of error bits in the read data is greater than a predetermined threshold value. The threshold value may be different from the threshold value at step S807.

As a result of determination at S813, when the number of error bits is greater than the predetermined threshold value, the storage device 50 may perform a refresh operation.

As a result of determination at step S813, the process flow may be terminated when the number of error bits is not greater than the predetermined threshold value.

Figure 9:
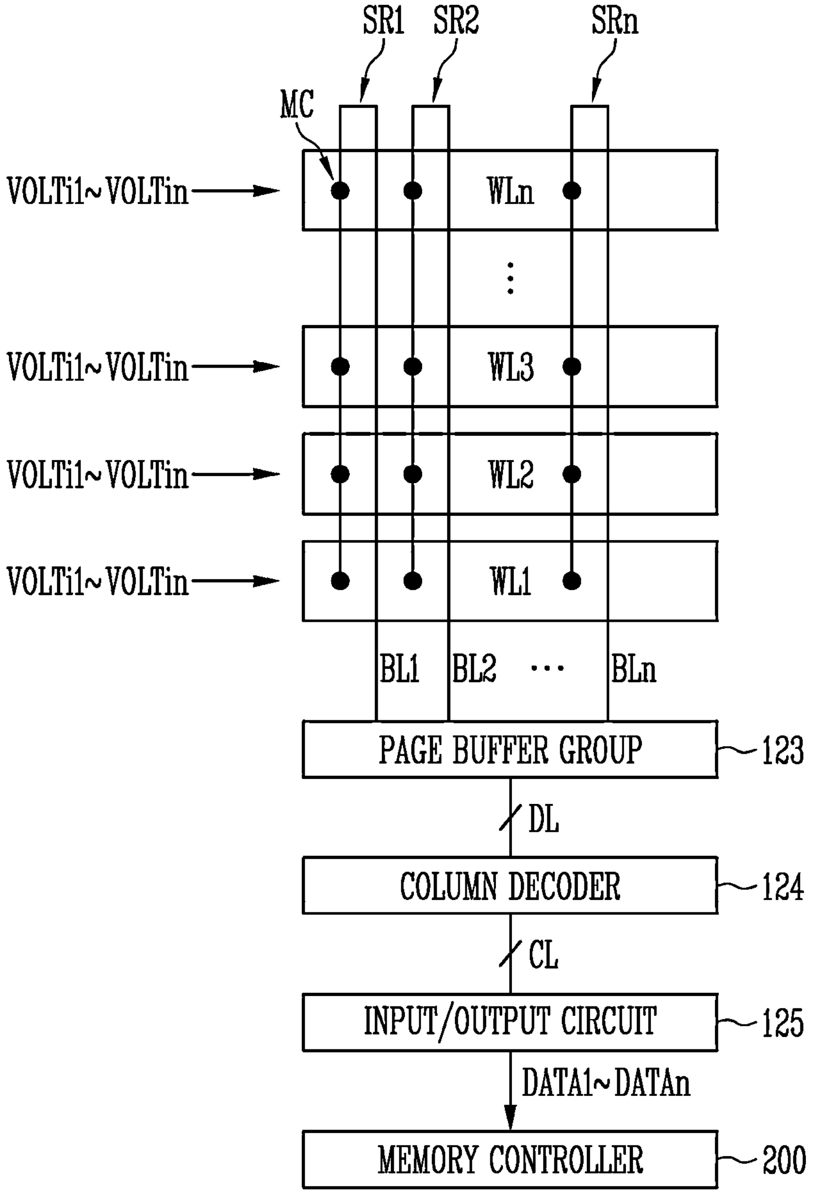
FIG. 9 is a diagram illustrating another example of a threshold voltage detecting operation according to an embodiment of the present disclosure.

FIG. 9 is a diagram illustrating another example of a threshold voltage detecting operation according to an embodiment of the present disclosure. In FIG. 9, an 'i' number of word lines, among the plurality of word lines WL1 to WLn, correspond to a program state.

Referring to FIG. 9, a memory device 100 may sequentially apply a plurality of first to nth threshold voltage detecting voltages VOLTi1 to VOLTin to a plurality of word lines WL1 to WLn. The same voltage is applied to the plurality of word lines at the same time.

According to an embodiment, the memory device 100 may sequentially apply the plurality of first to nth threshold voltage detecting voltages VOLTi1 to VOLTin to the plurality of word lines WL1 to WLn in order of voltage levels from highest to lowest. For example, the memory device 100 may simultaneously apply the nth threshold voltage detecting voltage VOLTin having the highest level to the plurality of word lines WL1 to WLn. Subsequently, the memory device 100 may simultaneously apply an (n−1)th threshold voltage detecting voltage VOLTin−1 having the next highest level to the plurality of word lines WL1 to WLn. This is repeated until the memory device 100 may simultaneously apply the first threshold voltage detecting voltage VOLTi1 having the lowest level to the plurality of word lines WL1 to WLn.

According to an embodiment, the memory device 100 may sequentially apply the plurality of first to nth threshold voltage detecting voltages VOLTi1 to VOLTin to the plurality of word lines WL1 to WLn in order of voltage levels from lowest to highest. For example, the memory device 100 may simultaneously apply the first threshold voltage detecting voltage VOLTi1 having the lowest level to the plurality of word lines WL1 to WLn. Subsequently, the memory device 100 may simultaneously apply the second threshold voltage detecting voltage VOLTi2 having the next lowest level to the plurality of word lines WL1 to WLn. This is repeated until the memory device 100 may simultaneously apply the nth threshold voltage detecting voltage VOLTin having the highest level to the plurality of word lines WL1 to WLn.

The memory device 100 may provide read data DATA1 to DATAn, which are read according to the plurality of first to nth threshold voltage detecting voltages VOLTi1 to VOLTin, to the memory controller 200 through the page buffer group 123, the column decoder 124, and the input/output circuit 125.

According to an embodiment, the memory device 100 may detect a threshold voltage corresponding to each of the plurality of strings SR1 to SRn when sequentially applying the plurality of first to nth threshold voltage detecting voltages VOLTi1 to VOLTin to the plurality of word lines WL1 to WLn.

Figure 10:
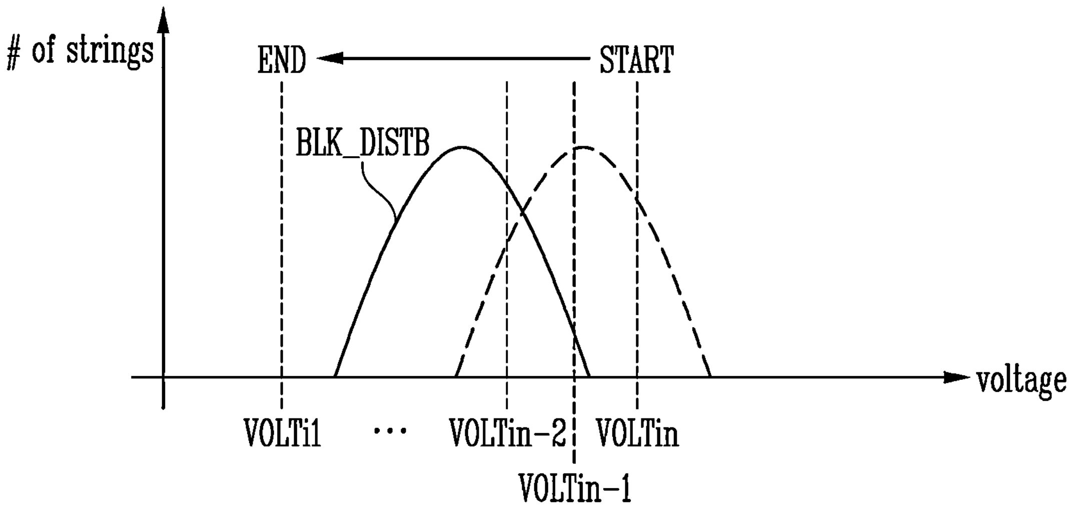
FIG. 10 is a diagram illustrating an example of determining a degree of deterioration of retention characteristics of a memory block according to an embodiment of the present disclosure.

FIG. 10 is a diagram illustrating an example of determining a degree of deterioration of retention characteristics of a memory block according to an embodiment of the present disclosure. In FIG. 10, it is assumed that a plurality of first to nth threshold voltage detecting voltages VOLTi1 to VOLTin are sequentially applied to a plurality of word lines WL1 to WLn in order of voltage levels from highest to lowest.

Referring to FIG. 10, a horizontal axis of a graph refers to a voltage magnitude and a vertical axis of the graph refers to a string count. In addition, a threshold voltage distribution indicated by a dotted line may represent an initial threshold voltage distribution of a memory block, and a threshold voltage distribution indicated by a solid line may represent a present threshold voltage distribution BLK_DISTB of the memory block. The present threshold voltage distribution BLK_DISTB may shift to the left more than the initial threshold voltage distribution according to retention characteristics of the memory block.

According to an embodiment, a memory controller 200 may count strings having a lower or higher voltage than each of the plurality of threshold voltages VOLTi1 to VOLTin among the plurality of strings on the basis of the read data corresponding to each of the plurality of first to nth threshold voltage detecting voltages VOLTi1 to VOLTin. The memory controller 200 may detect the current threshold voltage distribution BLK_DISTB on the basis of the voltage levels of the plurality of threshold voltage detecting voltages and the string count.

According to an embodiment, the memory controller 200 may determine a degree of deterioration of retention characteristics of the memory block on the basis of the detected present threshold voltage distribution BLK_DISTB. For example, the memory controller 200 may determine the degree of deterioration of retention characteristics of the memory block by comparing the present threshold voltage distribution BLK_DISTB with the initial threshold voltage distribution and by comparing the threshold voltage, which most strings have exceeded, with the predetermined reference voltage. The degree of the deterioration of the retention characteristics may include a period during which the retention characteristics are deteriorated, operational speed, and the like.

Figure 11:
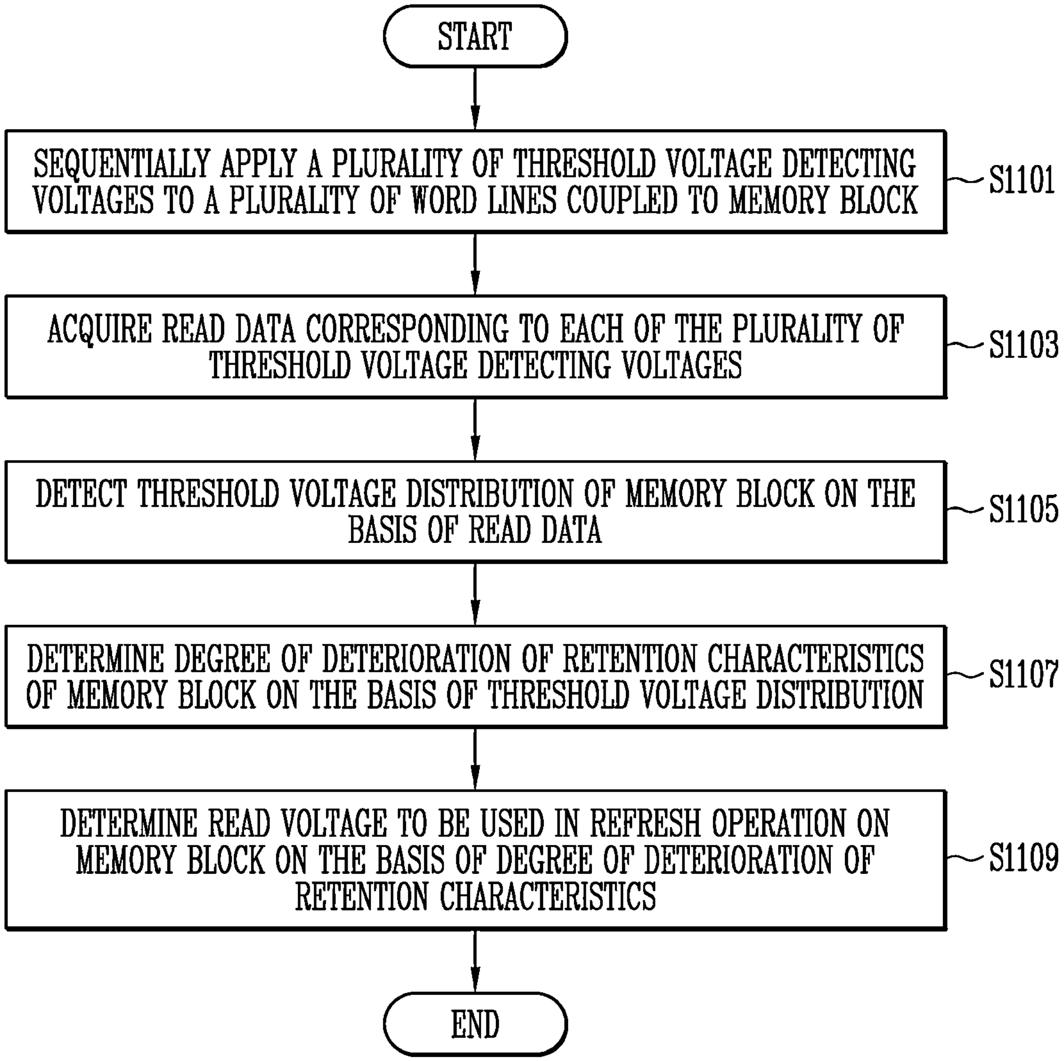
FIG. 11 is a flowchart illustrating a method of determining a read voltage used to perform a refresh operation according to an embodiment of the present disclosure.

FIG. 11 is a flowchart illustrating a method of determining a read voltage used to perform a refresh operation according to an embodiment of the present disclosure. The method shown in FIG. 11 may be performed by, for example, a storage device 50 shown in FIG. 1.

More specifically, FIG. 11 may show a method of determining a read voltage to be used in a refresh operation based on a threshold voltage detecting operation as shown in FIG. 9 and an operation of determining the degree of deterioration of retention characteristics as shown in FIG. 10.

Referring to FIG. 11, at step S1101, the storage device 50 may sequentially apply a plurality of threshold voltage detecting voltages to a plurality of word lines coupled to a memory block.

At step S1103, the storage device 50 may acquire read data corresponding to the plurality of threshold voltage detecting voltages, respectively.

At step S1105, the storage device 50 may detect a threshold voltage distribution of the memory block on the basis of read data.

At step S1107, the storage device 50 may determine a degree of deterioration of retention characteristics of the memory block on the basis of the threshold voltage distribution.

At step S1109, the storage device 50 may determine a read voltage that is used to perform a refresh operation on the memory block on the basis of the degree of deterioration of retention characteristics. For example, the storage device 50 may determine the read voltage to be used in the refresh operation by increasing or decreasing a voltage level of the existing read voltage that is applied during the existing read operation on the basis of the degree of deterioration of retention characteristics.

Subsequently, though not shown in FIG. 11, when it is determined that the refresh operation is performed according to the method of FIG. 7 or 8, the storage device 50 may perform the refresh operation by using the determined read voltage.

Figure 12:
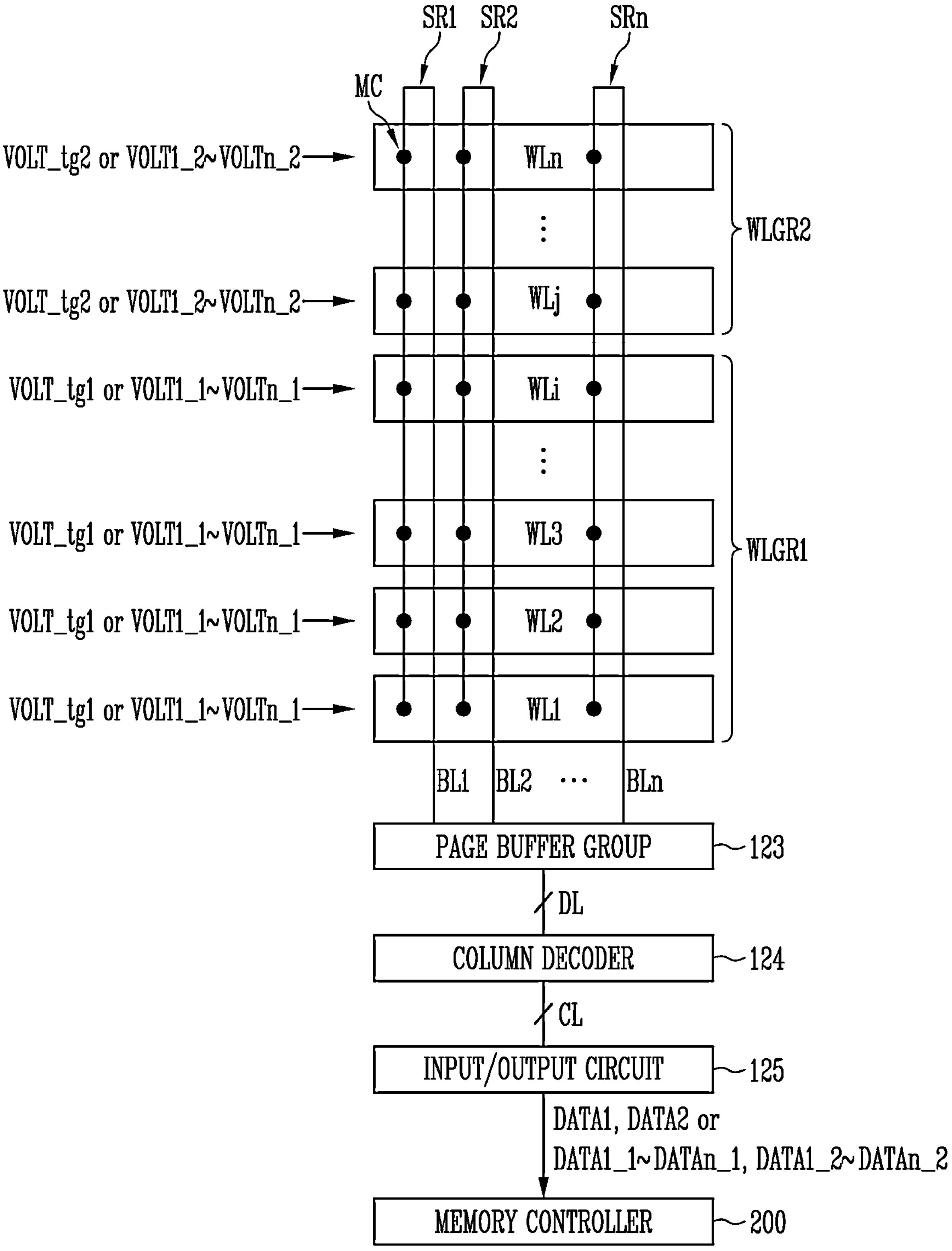
FIG. 12 is a diagram illustrating another example of a threshold voltage detecting operation according to an embodiment of the present disclosure.

FIG. 12 is a diagram illustrating another example of a threshold voltage detecting operation according to an embodiment of the present disclosure.

Referring to FIG. 12, a plurality of word lines WL1 to WLn may be divided into a plurality of word line groups (WLGR1 and WLGR2). For example, the plurality of word lines WL1 to WLn may be divided into a first word line group WLGR1, which includes first word lines WL1 to WLi, and a second word line group WLGR2, which includes second word lines WLj to WLn.

However, contrary to the example of FIG. 12, the number of word line groups, the number of word lines included in each of the word line groups, and a classification method of the word line groups may vary. For example, the plurality of word lines WL1 to WLn may be classified into three or more word line groups. In addition, the same number or different numbers of word lines may be included in the word line groups. In addition, odd-numbered word lines may be classified as one word line group, and even-numbered word lines may be classified as another word line group.

According to an embodiment, a memory device 100 may perform a first threshold voltage detecting operation by simultaneously applying a first target threshold voltage detecting voltage VOLT_tg1 among a plurality of threshold voltage detecting voltages to the first word lines WL1 to WLi. In addition, the memory device 100 may perform a second threshold voltage detecting operation by simultaneously applying a second target threshold voltage detecting voltage VOLT_tg2 among the plurality of threshold voltage detecting voltages to the second word lines WLj to WLn.

As described above with reference to FIG. 4, according to an embodiment, the first target threshold voltage detecting voltage VOLT_tg1 may be determined based on the number of word lines corresponding to an erase state or a program state among the first word lines WL1 to WLi. In addition, the second target threshold voltage detecting voltage VOLT_tg2 may be determined based on the number of word lines corresponding to an erase state or a program state among the second word lines WLj to WLn.

For example, the memory device 100 may apply the first target threshold voltage detecting voltage VOLT_tg1 having the same level to the first word lines WL1 to WLi at the same time. The memory device 100 may provide first read data DATA1, which is read by the first target threshold voltage detecting voltage VOLT_tg1, to the memory controller 200 through the page buffer group 123, the column decoder 124, and the input/output circuit 125. Subsequently, the memory device 100 may apply the second target threshold voltage detecting voltage VOLT_tg2 having the same level to the second word lines WLj to WLn at the same time. The memory device 100 may provide second read data DATA2, which is read by the second target threshold voltage detecting voltage VOLT_tg2, to the memory controller 200 through the page buffer group 123, the column decoder 124, and the input/output circuit 125.

According to an embodiment, the memory device 100 may sequentially apply a plurality of first threshold voltage detecting voltages VOLT1_1 to VOLTn_1 to the first word lines WL1 to WLi at the same time. In addition, the memory device 100 may sequentially apply a plurality of second threshold voltage detecting voltages VOLT1_2 to VOLTn_2 to the second word lines WLj to WLn at the same time.

As described above with reference to FIG. 4, according to an embodiment, the plurality of first threshold voltage detecting voltages VOLT1_1 to VOLTn_1 may be determined based on the number of word lines corresponding to an erase state or a program state among the first word lines WL1 to WLi. In addition, the plurality of second threshold voltage detecting voltages VOLT1_2 to VOLTn_2 may be determined based on the number of word lines corresponding to an erase state or a program state among the second word lines WLj to WLn.

For example, the memory device 100 may sequentially apply the plurality of first threshold voltage detecting voltages VOLT1_1 to VOLTn_1 to the first word lines WL1 to WLi in order of voltage levels from highest to lowest. The memory device 100 may provide read data DATA1_1 to DATAn_1, which are read according to the plurality of first threshold voltage detecting voltages VOLT1_1 to VOLTn_1, to the memory controller 200 through the page buffer group 123, the column decoder 124, and the input/output circuit 125. Subsequently, the memory device 100 may sequentially apply the plurality of second threshold voltage detecting voltages VOLT1_2 to VOLTn_2 to the second word lines WLj to WLn in order of voltage levels from highest to lowest. The memory device 100 may provide read data DATA1_2 to DATAn_2, which are read according to the plurality of second threshold voltage detecting voltages VOLT1_2 to VOLTn_2, to the memory controller 200 through the page buffer group 123, the column decoder 124, and the input/output circuit 125.

In another example, the memory device 100 may sequentially apply the plurality of first threshold voltage detecting voltages VOLT1_1 to VOLTn_1 to the first word lines WL1 to WLi in order of voltage levels from lowest to highest. The memory device 100 may provide the read data DATA1_1 to DATAn_1, which are read according to the plurality of first threshold voltage detecting voltages VOLT1_1 to VOLTn_1, to the memory controller 200 through the page buffer group 123, the column decoder 124, and the input/output circuit 125. Subsequently, the memory device 100 may sequentially apply the plurality of second threshold voltage detecting voltages VOLT1_2 to VOLTn_2 to the second word lines WLj to WLn in order of voltage levels from lowest to highest. The memory device 100 may provide the read data DATA1_2 to DATAn_2, which are read according to the plurality of second threshold voltage detecting voltages VOLT1_2 to VOLTn_2, to the memory controller 200 through the page buffer group 123, the column decoder 124, and the input/output circuit 125.

Figure 13:
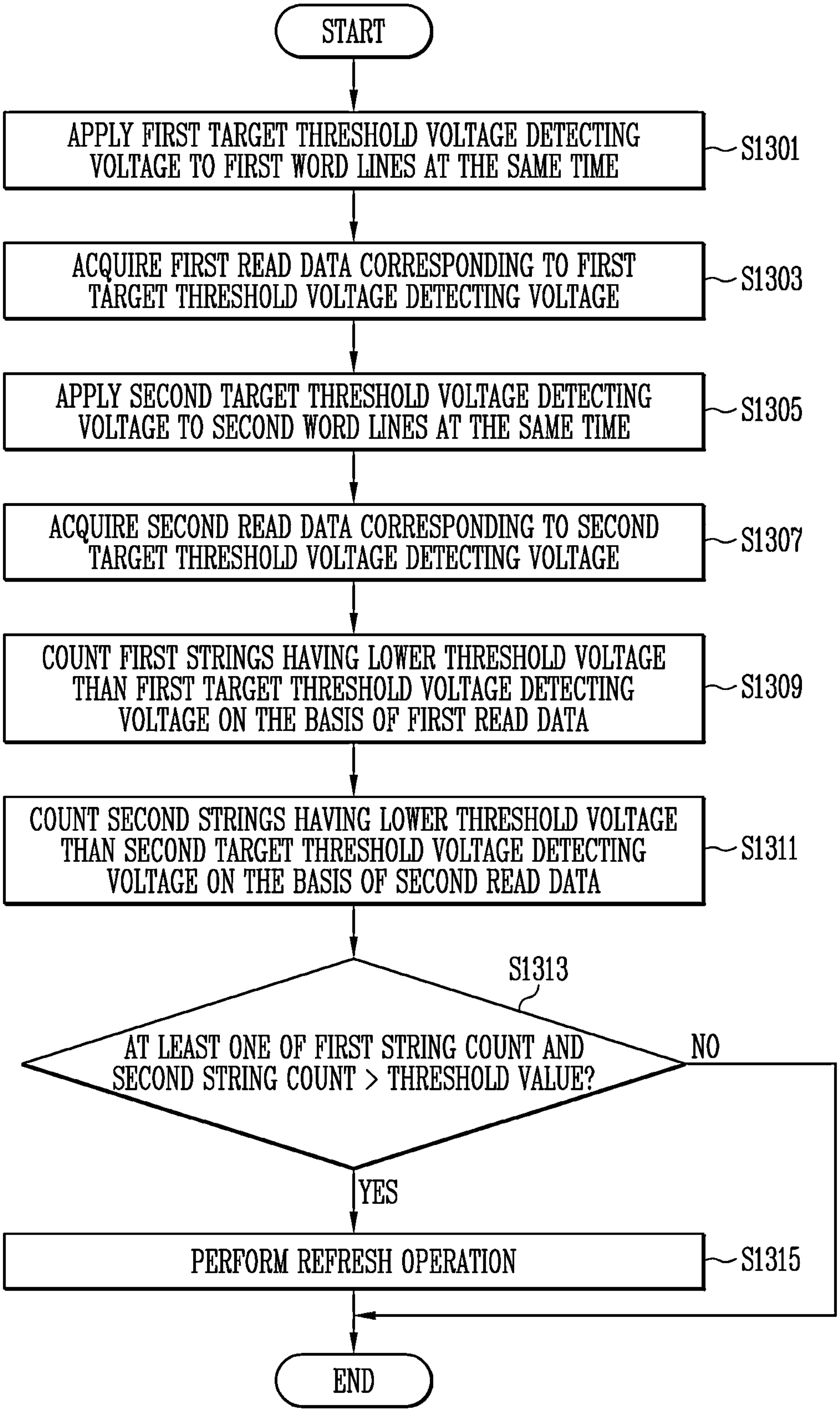
FIG. 13 is a flowchart illustrating another example of determining whether a refresh operation is performed according to an embodiment of the present disclosure.

FIG. 13 is a flowchart illustrating another example of determining whether a refresh operation is performed according to an embodiment of the present disclosure. The method shown in FIG. 13 may be performed by, for example, a storage device 50 shown in FIG. 1.

Referring to FIG. 13, at step S1301, the storage device 50 may simultaneously apply a first target threshold voltage detecting voltage to first word lines.

At step S1303, the storage device 50 may acquire first read data corresponding to the first target threshold voltage detecting voltage.

At step S1305, the storage device 50 may apply a second target threshold voltage detecting voltage to second word lines at the same time.

At step S1307, the storage device 50 may acquire second read data corresponding to the second target threshold voltage detecting voltage.

At step S1309, the storage device 50 may count first strings having a lower threshold voltage than the first target threshold voltage detecting voltage on the basis of the first read data.

At step S1311, the storage device 50 may count second strings having a lower threshold voltage than the second target threshold voltage detecting voltage on the basis of the second read data. According to an embodiment, the storage device 50 may count the first strings and the second strings through operations of counting strings as shown in FIG. 6.

In addition, though not shown, the storage device 50 may determine a read voltage to be used during a refresh operation by performing the operation of determining a degree of deterioration of retention characteristics as shown in FIG. 10.

At step S1313, the storage device 50 may determine whether at least one of the first string count and the second string count is greater than a predetermined threshold value. However, contrary to the example shown in FIG. 13, in other embodiments, the storage device 50 may determine whether the sum of the first string count and the second string count is greater than the predetermined threshold value. In addition, the storage device 50 may determine whether the first string count and the second string count are greater than the predetermined threshold value.

As a result of determination at step S1313, when at least one of the first string count and the second string count is greater than the predetermined threshold value, the storage device 50 may perform a refresh operation at step S1315.

When it is determined, as the result of determination at step S1313, that both the first string count and the second string count are not greater than the predetermined threshold value, the process flow may be terminated.

Figure 14:
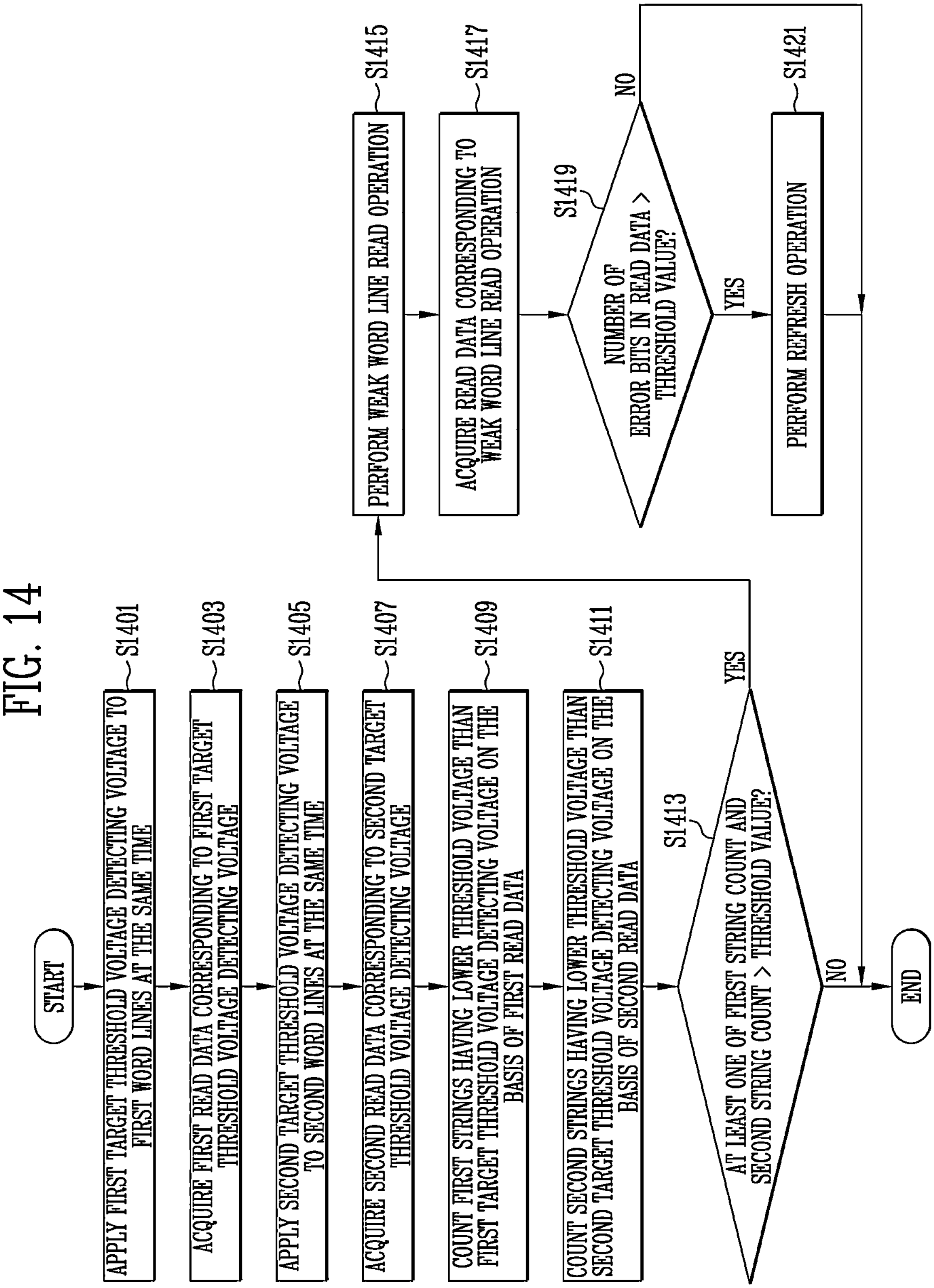
FIG. 14 is a flowchart illustrating another example of a method of determining whether a refresh operation is performed according to an embodiment of the present disclosure.

FIG. 14 is a flowchart illustrating another example of a method of determining whether a refresh operation is performed according to an embodiment of the present disclosure. The method shown in FIG. 14 may be performed by, for example, a storage device 50 shown in FIG. 1.

More specifically, compared to FIG. 13, FIG. 14 may show a method of further performing a weak word line read operation.

Steps S1401, S1403, S1405, S1407, S1409, S1411 and S1413 as shown in FIG. 14 are the same as steps S1301, S1303, S1305, S1307, S1309, S1311 and S1313 as shown in FIG. 13. Thus, a description thereof will be omitted.

Referring to FIG. 14, as a result of determination at step S1413, when at least one of the first string count and the second string count is greater than a predetermined threshold value, the storage device 50 may perform a weak word line read operation at step S1415. On the other hand, when it is determined, as the result of determination at step S1413, that both the first string count and the second string count are not greater than the predetermined threshold value, the process flow may be terminated.

At step S1417, the storage device 50 may acquire read data corresponding to the weak word line read operation.

At step S1419, the storage device 50 may determine whether the number of error bits in the read data is greater than a predetermined threshold value. The threshold value may be different from the threshold value at step S1413.

As a result of determination at step S1419, when the number of error bits is greater than the predetermined threshold value, the storage device 50 may perform a refresh operation at step S1421.

As a result of determination at step S1419, the process flow may be terminated when the number of error bits is not greater than the predetermined threshold value.

The present disclosure provides a storage device improving performance of a scan operation and reducing a time taken to perform the scan operation.

In the above-discussed embodiments, all steps may be selectively performed or skipped. In addition, the steps in each embodiment may not always be performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure. It will be apparent to those skilled in the art that various modifications can be made to the above-described exemplary embodiments of the present disclosure without departing from the spirit or scope of the invention. Thus, it is intended that the present disclosure cover all such modifications provided they come within the scope of the appended claims and their equivalents.

What is claimed is:

1. A storage device, comprising:

a memory device, including a memory block including a plurality of strings each including a plurality of memory cells, configured to perform a threshold voltage detecting operation of detecting a threshold voltage corresponding to each of the plurality of strings by simultaneously applying a detecting voltage to a plurality of word lines coupled to the plurality of memory cells; and a memory controller configured to receive read data read by the threshold voltage detecting operation from the memory device, to determine a number of strings having a lower threshold voltage than the detecting voltage based on the read data, and to determine whether to perform a refresh operation on the memory block based on the determined number of strings, wherein the memory controller determines whether to perform a weak word line read operation on the memory block based on the determined number of strings.

2. The storage device of claim 1, wherein at least one of the plurality of memory cells is programmed into one of a plurality of program states distinguished from each other based on threshold voltages.

3. The storage device of claim 1, wherein the memory controller provides the memory device with an address corresponding to the plurality of word lines and a command to perform the threshold voltage detecting operation.

4. The storage device of claim 1, wherein the memory device applies the detecting voltage having a same level to the plurality of word lines at the same time.

5. The storage device of claim 1, wherein voltage levels of the detecting voltage are determined by a number of word lines corresponding to an erase state or a program state among the plurality of word lines.

6. The storage device of claim 1, wherein the memory controller controls the memory device to perform the refresh operation when the determined number of strings is greater than a predetermined threshold value.

7. The storage device of claim 1, wherein the memory device sequentially applies a plurality of threshold voltage detecting voltages to the plurality of word lines in order of voltage levels from highest to lowest.

8. The storage device of claim 7, wherein the memory controller detects a threshold voltage distribution of the memory block on the basis of the read data corresponding to each of the plurality of threshold voltage detecting voltages and determines a degree of deterioration of retention characteristics of the memory block on the basis of the threshold voltage distribution.

9. The storage device of claim 8, wherein the memory controller determines a read voltage to be used in the refresh operation on the basis of the degree of the deterioration of the retention characteristics.

10. The storage device of claim 1, wherein the memory controller provides the memory device with an address corresponding to at least one weak word line among the plurality of word lines and a command for instructing to perform the weak word line read operation when the determined number of strings is greater than a predetermined threshold value.

11. The storage device of claim 10, wherein the memory controller determines whether to perform the refresh operation on the basis of read data obtained by the weak word line read operation.

12. A method of operating a storage device, the method comprising:

sequentially applying a detecting voltage from among a plurality of threshold voltage detecting voltages to a plurality of word lines coupled to a memory block including a plurality of strings;

acquiring read data corresponding to the detecting voltage;

determining a number of strings, from among the plurality of strings, having a lower threshold voltage than the detecting voltage; and determining whether to perform a weak word line read operation on a weak word line of the memory block based on the determined number of strings.

13. The method of claim 12, further comprising:

detecting a threshold voltage distribution of memory block on the basis of the read data; and determining a degree of deterioration of retention characteristics of the memory block on the basis of the threshold voltage distribution.

14. The method of claim 13, further comprising determining a read voltage to be used in a refresh operation on the memory block on the basis of the degree of the deterioration of the retention characteristics.

15. A storage device, comprising:

a memory device including a memory block including a plurality of strings each including a plurality of memory cells, configured to perform a first threshold voltage detecting operation of detecting a threshold voltage corresponding to each of the plurality of strings by simultaneously applying a first detecting voltage to first word lines among a plurality of word lines coupled to the plurality of memory cells, and to perform a second threshold voltage detecting operation of detecting the threshold voltage corresponding to each of the plurality of strings by simultaneously applying a second detecting voltage to second word lines among the plurality of word lines; and a memory controller configured to receive first read data read by the first threshold voltage detecting operation and second read data read by the second threshold voltage detecting operation from the memory device, to determine a number of first strings having a lower threshold voltage than the first detecting voltage on the basis of the first read data, to determine a number of second strings having a lower threshold voltage than the second detecting voltage on the basis of the second read data, and to determine whether to perform a refresh operation on the memory block based on the determined number of first strings and the determined number of second strings, wherein the memory controller performs a weak word line read operation on the memory block according to the determined number of first strings and the determined number of second strings and determines whether to perform the refresh operation on the basis of read data acquired by the weak word line read operation.

16. The storage device of claim 15, wherein a voltage level of the first detecting voltage is determined by a number of word lines corresponding to an erase state or a program state among the first word lines, and a voltage level of the second detecting voltage is determined by a number of word lines corresponding to the erase state or the program state among the second word lines.

* * * * *